(12) United States Patent
Xiang et al.

(10) Patent No.: US 6,200,863 B1
(45) Date of Patent: Mar. 13, 2001

(54) PROCESS FOR FABRICATING A SEMICONDUCTOR DEVICE HAVING ASSYMETRIC SOURCE-DRAIN EXTENSION REGIONS

(75) Inventors: Qi Xiang, Santa Clara; Dong-Hyuk Ju, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/275,918

(22) Filed: Mar. 24, 1999

(51) Int. Cl.[7] .................................................. H01L 21/336
(52) U.S. Cl. ......................... 438/286; 438/305; 438/775
(58) Field of Search .................................. 438/286, 301, 438/303, 305, 307, 528, 302, 723, FOR 158, 775, FOR 199

(56) References Cited

U.S. PATENT DOCUMENTS 5,629,220 * 5/1997 Yang .

OTHER PUBLICATIONS

Wolf, Stanley. Silicon Processing for the VLSI Era, vol. 1, Process Technology. Lattic Press, Sunset Beach California. p. 532, Aug. 1986.*

* cited by examiner

Primary Examiner—George Fourson
Assistant Examiner—Barbara Elizabeth Abbott
(74) Attorney, Agent, or Firm—Brinks Hofer Gilson & Lione

(57) ABSTRACT

A method for fabricating a semiconductor device having asymmetric source-drain extension regions includes the formation of a conformal layer of spacer forming material over a gate electrode. Nitrogen atoms are directionally introduced into the sidewall spacer material to form nitrogenated regions within the sidewall spacer material. The gate electrode casts a shadow over a portion of the sidewall spacer material adjacent to an edge of the gate electrode that is opposite from the direction of introduction of the nitrogen atoms. The shadow region of the sidewall spacer material remains free of nitrogen atoms. The shadow region of the sidewall spacer material is converted into a sidewall spacer by isotropically etching away the nitrogenated regions, while not substantially etching the shadow region. The asymmetrically formed sidewall spacer can then be used to mask a portion of the substrate adjacent to the drain edge of the gate electrode. Heavily-doped source-drain extension regions are formed in which the drain-side extension region is displaced away from the drain-side edge of the gate electrode by a distance equivalent to the lateral extent of the sidewall spacer. Upon removal of the sidewall spacer, a lightly-doped source-drain extension region is formed adjacent to the drain-side edge of the gate electrode.

19 Claims, 4 Drawing Sheets

PROCESS FOR FABRICATING A SEMICONDUCTOR DEVICE HAVING ASSYMETRIC SOURCE-DRAIN EXTENSION REGIONS

FIELD OF THE INVENTION

This invention relates, in general, to a process for fabricating semiconductor devices and, more particularly, to a process for forming source-drain extension regions in a metal-oxide-semiconductor (MOS) transistor.

BACKGROUND OF THE INVENTION

There is a continuing trend with the semiconductor industry to fabricate device components of integrated circuits to smaller and smaller dimensions. As the dimension of device components, such as MOS transistors, are reduced to a gate length below about 0.5 microns, new technical problems arise that result in a loss of device performance. The factors associated with the loss of performance include, but are not limited to, low source-drain breakdown voltage, sub-threshold leakage, increased junction capacitance, and threshold voltage instability. These problems, known collectively as short channel effects, are related to the electrodynamics of the transistor channel during operation. In the scaling of transistor dimensions to smaller values, an attempt is made to either keep the internal electric fields constant, or to maintain long channel characteristics by subduing the sub-threshold drain current as the drain voltage is increased. Both of these methods require adjusting the electric field in the channel, such that the peak lateral electric field of the drain depletion region is minimized.

To address the problem of threshold voltage instability the injection of hot carriers into the gate oxide must be controlled. Hot carrier injection occurs as the result of a large electric field developed in the substrate near the drain region when the transistor is operated in a saturated condition. The large electric field at the drain edge provides sufficient potential to force carriers into the transistor gate dielectric. The injected carriers increase the amount of trapped charge in the gate dielectric layer. The trap charge exerts an influence over the channel region and effectively shifts the threshold voltage of the transistor. Over time, the amount of charge trapped in the gate dielectric layer increases as the transistor is repeatedly brought to saturation conditions. Eventually, the threshold voltage is shifted to a point where the transistor can no longer be controlled by applying voltage to the gate electrode.

One solution to the problem of hot carrier injection is to form a lightly-doped drain (LDD) structure. The LDD structure includes lightly-doped source-drain regions in the substrate that are aligned with the edge of the gate electrode. Heavily-doped source and drain regions are also located in the substrate, but are laterally displaced from the gate electrode. The lightly-doped region is diffused just under the gate dielectric and produces a smaller electric field near the drain edge, thus reducing hot carrier injection into the gate dielectric. The heavily-doped source and drain regions provide a low resistance regions where ohmic contacts can be made to the transistor.

Although LDD structures effectively control hot carrier injection in very-larger-scale-integration (VLSI) transistors having gate length on the order of about 0.5 microns, with the advent of deep-submicron technology for ultra-large-scale-integration-circuits (ULSI), the LDD structure must be modified to address additional technical problems. The ULSI devices have gate lengths on the order of 0.25 to 0.1 microns. At these gate dimensions, series resistance within a transistor increases to the point of degrading the speed of a transistor. To increase the current conduction in the transistor, the lightly-doped regions of the LDD structure are replaced with heavily-doped shallow source-drain extension regions. Although the increased doping level of the source-drain extension regions relative to the LDD structure reduces the series resistance, the heavily-doped drain extension regions result in a high electric field near the drain edge. As in earlier generation VLSI transistors, the increased electric field causes hot carrier injection into the gate dielectric layer.

The increased electric field near the drain edge can be reduced by lowering the doping concentration of the extension region adjacent to the drain of the transistor. For example, in the fabrication of transistors having gate lengths on the order of about 0.5 microns or larger, conventional photolithographic techniques can be used to mask the drain-side of the transistor with photoresist. Once the lithographic mask is in place, selective doping procedures can be carried out to asymmetrically dope the source-drain extension regions. Although the photolithographic technique offers a practical solution to the problem of adjusting the doping concentration in source-drain extension regions, as the gate length is scaled down to about 0.1 microns and lower it becomes more difficult to align the photoresist mask to the drain of the transistors. At the 0.1 micron level, even slight misalignment of the photolithographic mask can result in improperly doped regions in the transistor. In extreme cases, the device will fail to operate or will suffer severe performance degradation. Accordingly, an improved processing method is necessary to precisely form asymmetrically-doped source-drain extension regions in ULSI MOS transistors.

SUMMARY OF THE INVENTION

The present invention is for a process of fabricating a semiconductor device having asymmetric source-drain extension regions. The process of the invention precisely forms asymmetrically-doped source-drain extension regions without using a lithographic mass. By avoiding the need to perform a critical lithographic alignment, MOS transistors having gate lengths on the order of about 0.1 microns and smaller can be reliably fabricated.

In one form, the process of the invention includes providing a semiconductor substrate having a gate dielectric layer overlying the substrate. A gate electrode having a source-side and a drain-side is formed to overlie the gate dielectric layer. A layer of sidewall spacer material is formed to overlie the gate electrode. A sidewall spacer is formed on the drain-side of the gate electrode by directionally introducing nitrogen atoms into the sidewall spacer material. Then, the sidewall spacer material is isotropically etched. Once the sidewall spacer on the drain-side of the gate electrode is formed, a first source-drain extension region is formed in the semiconductor substrate adjacent to the source-side of the gate electrode. Further processing steps can then be carried out to form a source-drain extension region adjacent to the drain-side of the gate electrode having a doping concentration different from the doping concentration of the source-drain extension region adjacent to the source-side of the gate electrode.

BRIEF DESCRIPTION OF THE DRAWINGS

It will be appreciated that for simplicity and clarity of illustration, elements shown in Figures have not necessarily been drawn to scale. Further, where considered appropriate, reference numbers have been repeated among the Figures to indicate corresponding elements.

DETAILED DESCRIPTION OF PREFERRED EMBODIMENTS

FIGS. 1–8 illustrate, in cross-section, process steps in accordance with one embodiment of the invention for the fabrication of an MOS transistor. Such a transistor can be used in a wide variety of integrated circuit devices, such as both volatile and non-volatile memory devices, microprocessor devices, microcontroller devices, and the like. In the following description, the invention is illustrated by a process for fabricating an n-channel MOS transistor. It is to be understood that, in a similar manner, a p-channel resistor can also be formed by selecting species and materials of the opposite polarity and conductivity type.

Figure 1:
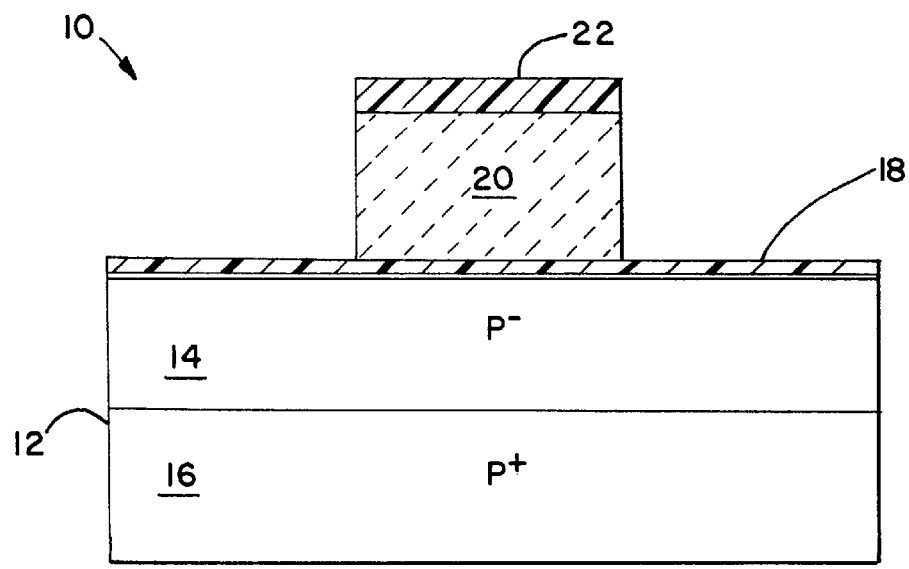
FIGS. 1–8 illustrate, in cross-section, processing steps in accordance with the invention.
Figure 2:
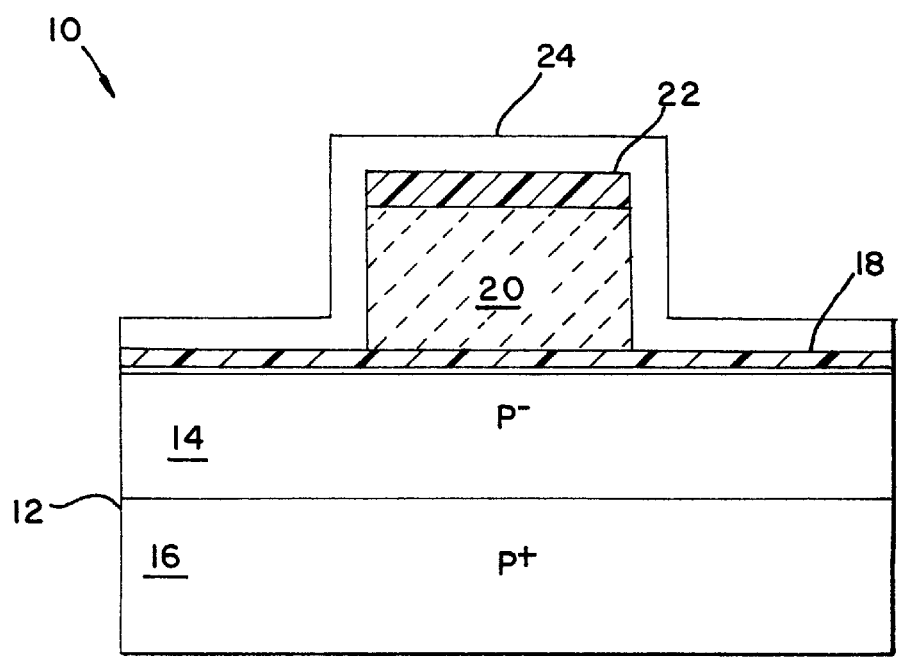

Shown in FIG. 1, in cross-section, is a portion of a semiconductor device 10 having already undergone several processing steps in accordance with the invention. A semiconductor substrate 12 includes a p− region 14 overlying a p+ region 16. A gate dielectric layer 18 overlies p− region 14. Preferably, gate dielectric layer 18 is a silicon nitride/oxide stack having a silicon dioxide buffer layer on the substrate surface and a silicon nitride layer overlying the buffer layer. The silicon dioxide buffer layer is preferably formed to a thickness of about 5 to about 10 Å, and more preferably, to about 5 Å. The silicon nitride layer is preferably formed to a thickness of about 10 to 30 Å. Alternatively, gate dielectric layer 18 can be a thermally grown silicon dioxide layer, or a oxynitride layer, or the like. A gate electrode 20 overlies gate dielectric layer 18. Preferably, gate electrode 20 is formed by chemical-vapor-deposition (CVD) of polycrystalline silicon followed by lithographic patterning and reactive-ion-etching (RIE). Alternatively, gate electrode 20 can be fabricated with a material, such as a refractory-metal silicide, and the like.

During the fabrication of gate electrode 20, an antireflective coating 22 can be deposited onto the polycrystalline silicon prior to lithographic patterning and etching. Antireflective coating 22 functions to reduce light reflection during lithographic patterning, thereby improving the precision of the alignment of lithographic masks to semiconductor substrate 12. Although the use of antireflective coating 22 is not essential to the method of the present invention, as described in more detail below, antireflective coating 22 increases the height of gate electrode 20.

After forming gate electrode 20, a layer of sidewall spacer material 24 is deposited to overlie gate electrode 20 and exposed portions of gate dielectric layer 18. Preferably, sidewall spacer material 24 is a spacer forming material that can be conformally deposited and that is differentially etchable with respect to the materials of gate electrode 20 and gate dielectric layer 18. For example, where gate dielectric layer 18 is silicon nitride and antireflective coating 22 is silicon oxynitride, sidewall spacer material 24 can be a dielectric material, such a silicon oxide, and the like. Preferably, the silicon oxide material is conformally deposited by CVD to a thickness of about 600 to 1500 Å. In accordance with the invention, sidewall spacer material 24 must be a material that can be rendered differentially etchable by the introduction of a foreign species into the material.

Figure 3:
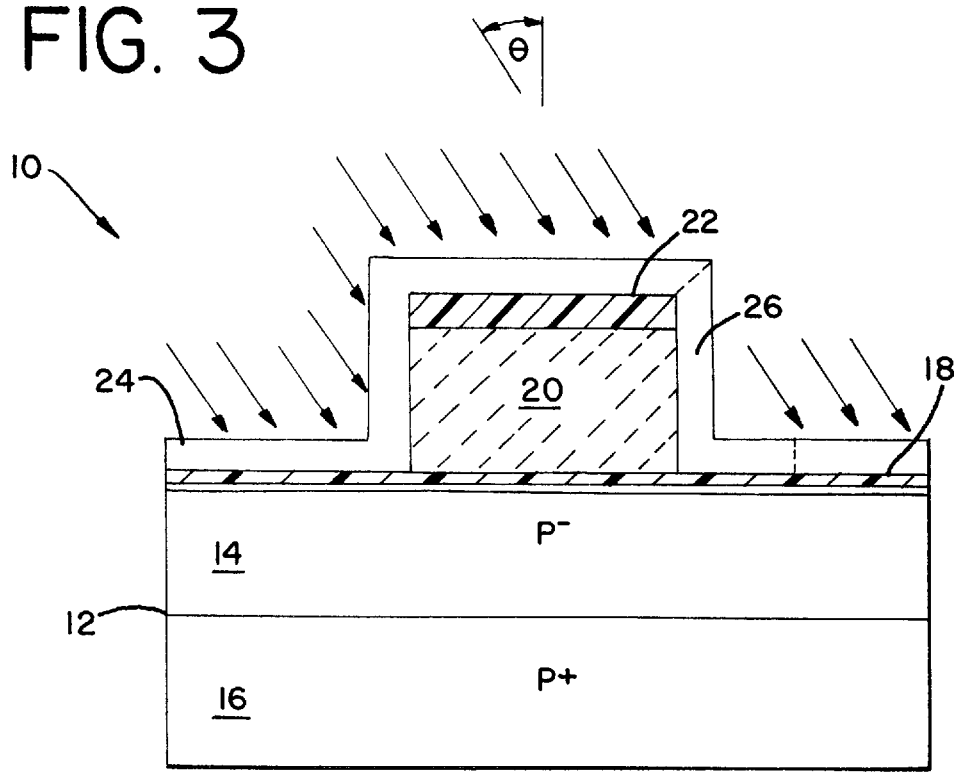
Figure 4:
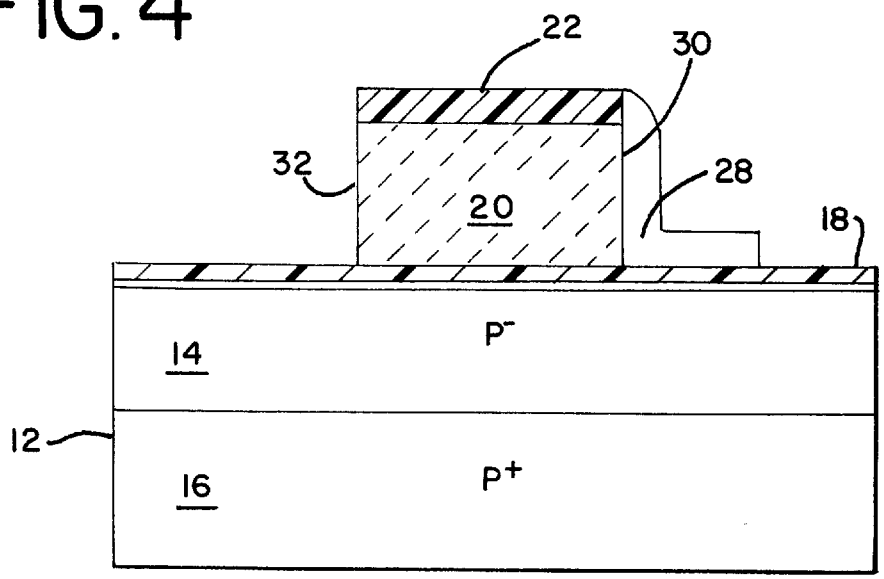

The inventive process continues with the directional introduction of nitrogen into sidewall spacer material 24. As illustrated in FIG. 3, the angle of introduction of nitrogen is offset from the normal by a predetermined offset angle θ. By introducing nitrogen at an offset angle θ, a portion 26 of sidewall spacer material 24 remains free of nitrogen, because of the shadowing effect of gate electrode 20. In addition to the magnitude of the offset angle θ, the amount of sidewall spacer material 24 not receiving nitrogen additionally depends upon the height of gate electrode 20 above gate dielectric layer 18. Accordingly, the lateral extent of shadow region 26 along gate dielectric layer 18 depends on both the magnitude of offset angle θ and the height of gate electrode 20 above gate dielectric layer 18. The height of gate electrode 20 equals the summation of the deposition thickness of the polycrystalline silicon material and the silicon oxynitride antireflective coating material. For example, where the height of gate electrode 20 and any overlying layers is about 1000 to 3000 Å, offset angle θ is preferably about 20 to 50°. In other embodiments of the invention, the height of gate electrode 20 can include additional layers, such as those used in composite gate electrodes, and the like.

In a preferred embodiment of the invention, the directional introduction of nitrogen is carried out by ion implantation. Nitrogen is implanted into sidewall spacer material 24 using a dose of preferably about 1E14 to 4E15 ions per square centimeter, and more preferably, about 1E15 ions per square centimeter. The implantation energy will depend, in part, upon the deposited thickness of sidewall spacer material 24. For example, where sidewall spacer material 24 is deposited to a thickness of about 1000 Å, the nitrogen implantation is carried out at an energy of about 20 keV.

Following the directional introduction of nitrogen into sidewall spacer material 24, an isotropic etching process is carried out to form a sidewall spacer 28 adjacent to a drain-side edge 30 of gate electrode 20. The isotropic etch selectively removes portions of sidewall spacer material 24 containing nitrogen. Thus, sidewall spacer material 24 is completely removed from a source-side edge 32 of gate electrode 20. Additionally, portions of sidewall spacer material 24 containing nitrogen and overlying the surface of gate dielectric layer 18 are also removed by the isotropic edge.

In the preferred embodiment of the invention, where sidewall spacer material 24 is a silicon oxide, the nitrogenated regions of sidewall spacer material 24 are removed by wet etching techniques. For example, a dilute hydrofluoric acid solution can be used to remove the nitrogenated portions of sidewall spacer material 24, while not substantially etching the spacer material in shadow region 26. By selectively isotropically etching only the nitrogenated portions of sidewall spacer material 24, shadow region 24 is effectively transformed into sidewall spacer 28. The etch rate of the nitrogenated portions of sidewall spacer material 24 depends, in part, upon the concentration of the hydrofluoric acid etching solution. For example, where a hydrofluoric acid solution having about 30 parts water and 1 part hydrofluoric acid is used, the etch rate is about 500 Å per minute. Correspondingly, where the hydrofluoric acid solution is prepared using 100 parts water to 1 part hydrofluoric acid, the etch rate is about 100 Å per minute. These etch rates are far greater than the etch rate of sidewall spacer material that does not contain nitrogen. For example, the etch rate of nitrogen-free silicon oxide in 30:1 hydrofluoric acid solution is about 100 Å per minute, and the etch rate in 100:1 hydrofluoric acid solution is about 20 Å per minute.

Figure 5:
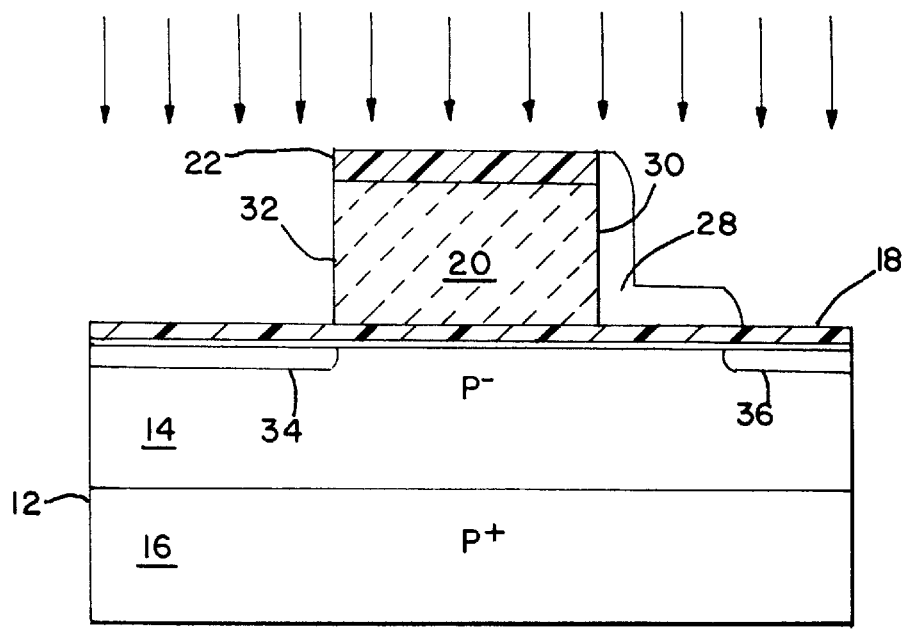

Once sidewall spacer 28 is formed, heavily-doped source-drain extension regions 34 and 36 are formed in p− region 14, as illustrated in FIG. 5. Preferably, source-drain extension regions 34 and 36 are formed by ion implantation of arsenic using a relatively high dose and low implantation energy. In one embodiment of the invention, source-drain extension regions 34 and 36 are formed by implantation of arsenic using a dose of about 8E14 to 2E15 ions per square centimeter and an implantation energy of about 1 to 10 keV. Alternatively, another n-type dopant, such as phosphorus, and the like, can also be used. Further, where the inventive process is used to form a p-channel device, the shallow source-drain extension regions can be formed by the ion implantation of a molecular ion, such as $BF_2$, and the like.

As depicted in FIG. 5, sidewall spacer 28 blocks the implantation of dopant ions into the portion of p− region 14 directly beneath sidewall spacer 28. Accordingly, source-drain extension region 36 is offset from drain-side edge 30 of gate electrode 20 by a distance that is approximately equal to the lateral extent of sidewall spacer 28 overlying gate dielectric layer 18. Additionally, the absence of a sidewall spacer adjacent to source-side edge 32 of gate electrode 20 results in the formation of source-drain extension region 34 in p− region 14 in spaced relation with source-side edge 32. By forming a relatively highly doped source-drain extension region near source-side edge 32, the series resistance of the MOS transistor remains low in the region of the transistor that does not contribute to hot carrier injection.

Figure 6:
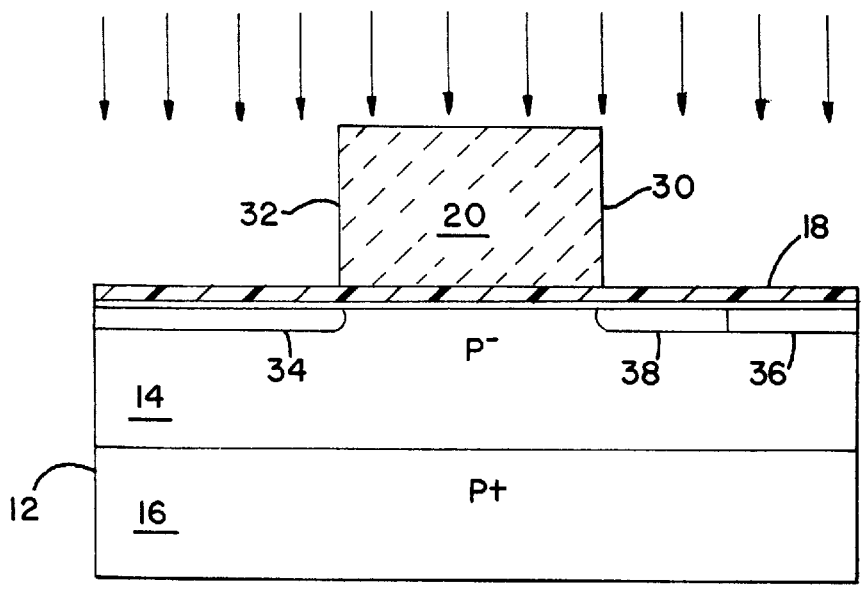

The inventive process continues with the removal of antireflective coating 22 and sidewall spacer 28, as illustrated in FIG. 6. Preferably, antireflective coating 22 and sidewall spacer 28 are removed by an isotropic etching process. In one embodiment, the dilute hydrofluoric acid solution previously used to remove nitrogenated regions of sidewall spacer material 24 can be used to remove antireflective coating 22 and sidewall spacer 28. These materials are etchable in a dilute hydrofluoric acid solution albeit at a much lower etch rate than the nitrogenated portions of sidewall spacer material 24. Alternatively, a plasma etching process can be carried out to isotropically etch away antireflective coating 22 and sidewall spacer 28. In the plasma etching process, fluorinated etching gases can be employed in a conventional isotropic plasma etching process.

Once antireflective coating 22 and sidewall spacer 28 are removed dopant atoms are introduced into p− region 14 to form a source-drain extension region 38 intermediate to source-drain extension region 36 and drain-side edge 30 of gate electrode 20. In a preferred embodiment of the invention, source-drain extension region 38 is formed by ion implantation of arsenic at relatively a low dose and low energy. Preferably, arsenic is implanted using a dose of about 8E13 to 8E14 ions per square centimeter and at an implantation energy of about 1 to 10 keV. By forming a relatively lightly-doped source-drain extension region in close proximity to drain-side edge 30 of gate electrode 20, hot carrier injection into gate dielectric layer 18 can be minimized.

A particular advantage of the present invention includes the ability to form heavily-doped source-drain extension regions in proximity to gate electrode 20, while selectively displacing the heavily-doped source-drain extension regions away from the drain edge of an MOS transistor. Accordingly, the doped region that generates the highest electric field is displaced away from the drain region.

Figure 7:
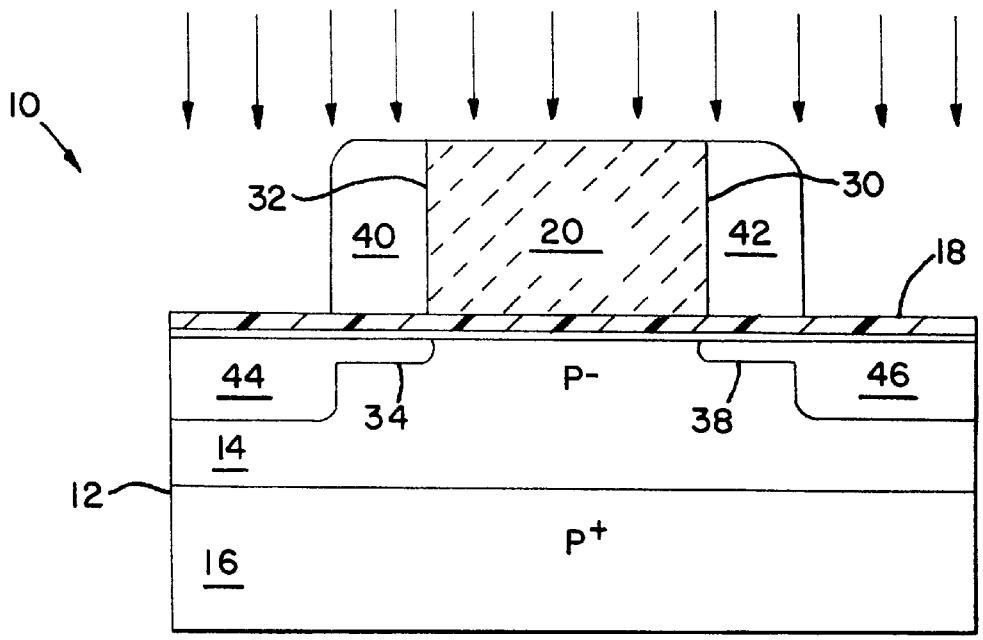

After the formation of the lightly-doped source-drain regions is complete, heavily-doped source-drain regions are formed in p− region 14. Preferably, the source-drain regions are formed using a conventional sidewall spacer and ion implantation process. As illustrated in FIG. 7, sidewall spacers 40 and 42 are formed adjacent to source-side edge 32 and drain-side edge 30, respectively.

Sidewall spacers 40 and 42 are conventionally formed by conformally depositing a layer of silicon oxide material, followed by anisotropic etching. In the anisotropic etching process, material overlying horizontally disposed surfaces is removed much more rapidly than material overlying vertically disposed surfaces. This etching process stands in sharp contrast to that used to form sidewall spacer 28. In the conventional sidewall spacer forming process, the vertical etching characteristics of anisotropic etching are employed to remove portions of the silicon oxide layer overlying the horizontal surfaces of gate electrode 20 and gate dielectric layer 18. Because of the directionality of the anisotropic etching process, portions of the silicon oxide adjacent to drain-side edge 30 and source-side edge 32 are not etched. Accordingly, the anisotropic etching process results in symmetrical sidewall spacers adjacent to structures, such as gate electrode 20.

After forming sidewall spacers 40 and 42, an ion implantation process is carried out to form a source region 44 and a drain region 46. Source region 44 is formed in p− region 14 in space relationship to sidewall spacer 40, while drain region 46 is formed in p− region 14 in spaced relationship with sidewall spacer 42. Sidewall spacer 42 protects the portion of p− region 14 directly underlying sidewall spacer 42. Accordingly, dopant ions introduced to form source and drain regions 44 and 46, do not enter source-drain extension region 38.

Figure 8:
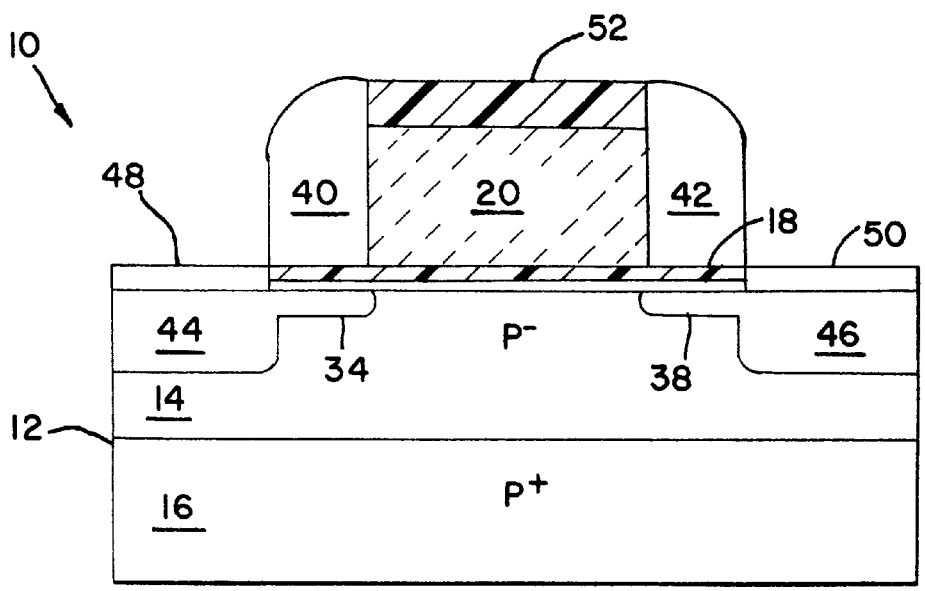

To further increase the performance of semiconductor device 10, silicide regions can be formed at the upper surfaces of the source-drain regions and the gate electrode. By forming suicide regions in the source-drain regions and at the surface of the gate electrodes, low-resistance contacts can be made to the MOS transistor. As shown in FIG. 8, a silicide region 48 is formed above source region 44, and a silicide region 50 is formed at the surface of drain region 46. Additionally, a silicide region 52 is formed at the upper surface of gate electrode 20. During subsequent processing to form a fully functional integrated circuit, metallized contacts can be made to the MOS transistor at the silicide regions. Silicide regions 48, 50 and 52 can be formed using a conventional silicide-forming process. After removing portions of gate dielectric layer 18 overlying source and source and drain regions 44 and 46, a refractory metal silicide can be deposited and a thermal annealing process carried out to form a refractory metal silicide. Alternatively, a refractory metal silicide can be directly deposited onto the surface of semiconductor substrate 10, followed by an annealing process.

Thus, it is apparent there has been disclosed in accordance with the invention, a process for fabricating a semiconductor device having asymmetric source-drain extension regions that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, magnetically enhanced reactive ion etching processes, deep UV-lithography and x-ray lithography techniques can be used. Additionally, various types of isotropic plasma etching processes, such as down-stream etching, and the like, can be used. It is therefore intended to include within the invention all such variations and modifications as fall within the scope of the appended claims and equivalents thereof.

What is claimed is:

1. A process for fabricating a semiconductor device comprising the steps of:

providing a semiconductor substrate having a gate electrode separated therefrom by a dielectric layer, the gate electrode having first and second edges;

forming a layer of sidewall spacer material overlying the first and second edges of the gate electrode;

directionally introducing nitrogen atoms into the sidewall spacer material to form a nitrogenated sidewall spacer material;

differentially etching the nitrogenated sidewall spacer material to form a sidewall spacer adjacent to the second edge of the gate electrode;

forming a first source-drain extension region in the semiconductor substrate in spaced relationship to the first edge of the gate electrode;

removing the sidewall spacer; and forming a second source-drain extension region in the semiconductor substrate in spaced relationship to the second edge of the gate electrode, wherein the first and second source-drain extension regions include dopant species, and wherein the concentration of the dopant species in the first source-drain extension region is greater than the concentration of dopant species in the second source-drain extension region.

2. The process of claim 1, wherein the step of introducing nitrogen atoms comprises selectively introducing nitrogen atoms into regions of the sidewall spacer material other than regions overlying and immediately adjacent to the second edge of the gate electrode.

3. The process of claim 1, wherein the step of introducing nitrogen atoms comprises ion implantation at an angle offset from normal.

4. The process of claim 3, wherein the step of introducing nitrogen atoms comprises ion implantation at an angle of incidence of about 20 to 50° with respect to normal.

5. The process of claim 3, wherein the step of introducing nitrogen atoms comprises ion implantation of nitrogen using a dose of about 1E14 to 4E15 ions per square centimeter.

6. The process of claim 1, wherein the step of forming a sidewall spacer material comprises depositing a silicon oxide layer.

7. The process of claim 6, wherein the step of differentially etching the sidewall spacer material comprises wet etching using a hydrofluoric acid solution.

8. A process for fabricating a semiconductor device comprising the steps of:

providing a semiconductor substrate having a gate dielectric layer thereon;

forming a gate electrode overlying the gate dielectric layer, the gate electrode having a source-side and a drain-side;

forming a layer of sidewall spacer material overlying the gate electrode;

selectively forming a sidewall spacer on the drain-side by directional introduction of nitrogen atoms into a selected region of the sidewall spacer material and isotropic etching of the selected region of the sidewall spacer material; and forming a first source-drain extension region in the semiconductor substrate adjacent to the source-side of the gate electrode.

9. The process of claim 8 further comprising the steps of:

removing the sidewall spacer; and forming a second source-drain extension region adjacent to the drain-side of the gate electrode.

10. The process of claim 9, wherein the first and second source-drain extension regions include a dopant species, and wherein the concentration of the dopant species in the first source-drain extension region is greater than the concentration of dopant species in the second source-drain extension region.

11. The process of claim 10 further comprising the steps of:

forming second sidewall spacers adjacent to the source-side and the drain-side of the gate electrode;

and forming source and drain regions in the semiconductor substrate using the second sidewall spacers as a masking layer.

12. The process of claim 8, wherein the step of selectively forming a sidewall spacer comprises ion implantation of nitrogen, wherein the gate electrode forms a shadow region on the sidewall spacer material adjacent to the drain-side, such that nitrogen atoms are substantially blocked from the shadow region by the gate electrode.

13. The process of claim 8, wherein the step of forming a layer of sidewall spacer material comprises depositing a silicon oxide layer.

14. The process of claim 13, wherein the step of isotropic etching comprises wet etching using a hydrofluoric acid solution.

15. A process for fabricating an asymmetric spacer structure on a gate electrode in a semiconductor device comprising the steps of:

forming a layer of sidewall spacer material overlying the gate electrode;

directionally introducing nitrogen into the sidewall spacer material to form nitrogenated spacer material, wherein the gate electrode casts a shadow on a portion of the sidewall spacer material adjacent to an opposite edge of the gate electrode, and wherein the portion of the sidewall spacer remains substantially nitrogen free; and isotropically etching the sidewall spacer material to remove the nitrogenated spacer material and to leave a sidewall spacer adjacent to the opposite edge of the gate electrode.

16. The process of claim 15, wherein the step of forming a layer of sidewall spacer material comprises depositing a silicon oxide layer.

17. The process of claim 16, wherein the step of forming a layer of sidewall spacer material comprises chemical vapor deposition of a silicon oxide layer.

18. The process of claim 17, wherein the step of isotropic etching comprises wet etching using a hydrofluoric acid solution.

19. The process of claim 15, wherein the step of directionally introducing nitrogen comprises ion implantation of nitrogen using a dose of about 1E14 to 4E15 ions per square centimeter.

* * * * *